United States Patent
Ymcheng1

(10) Patent No.: US 6,438,018 B1
(45) Date of Patent: Aug. 20, 2002

(54) VIA CODE MASK ROM

(75) Inventor: Ymcheng1, Pingtung (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/468,993

(22) Filed: Dec. 21, 1999

(30) Foreign Application Priority Data

Oct. 5, 1999 (TW) .......................................... 88117120

(51) Int. Cl.$^7$ .............................................. G11C 17/00
(52) U.S. Cl. .......................................... 365/94; 365/104
(58) Field of Search ........................... 365/94, 103, 104

(56) References Cited

U.S. PATENT DOCUMENTS 5,241,497 A * 8/1993 Komarek ............... 365/230.03
5,625,586 A * 4/1997 Yamasaki ............... 365/185.16
5,831,892 A * 11/1998 Thewes ....................... 365/104

* cited by examiner

*Primary Examiner*—A. Zarabian
(74) *Attorney, Agent, or Firm*—Fish & Richardson P.C.

(57) ABSTRACT

The present invention provides a Via Code Mask read-only memory comprising an array of transistors, and a plurality of bit lines and word lines, wherein the transistors in each row of the array are connected in series by connection of a drain/source of one transistor with a drain/source of another transistor. Both ends of the series of the transistors in each row of the array are connected to a supply voltage together. Each one of the bit lines is selectively connected to drain (s)/source(s) of one or more transistors in one corresponding column. Each one of the word lines connects together gates of the transistors in one corresponding row.

4 Claims, 2 Drawing Sheets

VIA CODE MASK ROM

BACKGROUND OF THE INVENTION

1. Field of the Invention

The present invention relates to a Mask read-only memory(Mask ROM), and particularly to a Via Code Mask ROM having a smaller circuit area.

2. Description of the Prior Art

Mask ROM is a basic kind of ROM. In manufacturing of a Mask ROM, the connections within the array of the memory cells for storing particular information are determined by a mask. Thus, to manufacture a ROM for storing different information, only the mask need be modified rather than the whole process of manufacture the ROM.

Referring to FIG. 1, a traditional Mask ROM comprises a row address decoder 101 receiving a row address 104, a column address decoder 102 receiving a column address 105 and having an output 106, and an array 103 of memory cells. The array 103 of memory cells comprises an array of transistors 111~144, 4 bit lines C1~C4 connected to the column address decoder 102 and 4 word lines R1~R4 connected to the row address decoder 101. In the array of the transistors 111~144, the connections between the transistors 111~144 and the bit lines C1~C4 are carried out by Via Code and shown in FIG. 1, wherein a black dot on the intersection of two crossed lines represents an electrical connection.

The operation of the traditional Mask ROM in FIG. 1 will be explained below. Initially, given that the voltage level on each of the word lines R1~R4 is lower than the threshold voltage, all the transistors 111~144 are turned off and the voltage level on each of the bit lines C1~C4 represents a "1" (logic high). When receiving the row address 104, the row address decoder 101 pulls up the voltage level on one of the word lines R1~R4 accordingly, to turn on a corresponding row of transistors. Specifically, if the word line R1 is selected, the voltage level thereon is pulled up to be higher than the threshold voltage and the transistors 111~114 are turned on. Since the bit lines C1, C3 and C4 are connected to the drains/sources of the transistor 111, 113 and 114, the logic levels of bit lines C1, C2, C3 and C4 are 0, 1, 0 and 0, respectively, when the word line R1 is selected. If the word line R2 is selected, the voltage level thereon is pulled up to be higher than the threshold voltage and the transistors 121~124 are turned on. Since the bit lines C1 and C3 are connected to the drains/sources of the transistor 121 and 123, the logic levels of bit lines C1, C2, C3 and C4 are 0, 1, 0 and 1, respectively, when the word line R2 is selected. If the word line R3 is selected, the voltage level thereon is pulled up to be higher than the threshold voltage and the transistors 131~134 are turned on. Since the bit lines C2 and C4 are connected to the drains/sources of the transistor 132 and 134, the logic levels of bit lines C1, C2, C3 and C4 are 1, 0, 1 and 0, respectively, when the word line R3 is selected. If the word line R4 is selected, the voltage level thereon is pulled up to be higher than the threshold voltage and the transistors 141~144 are turned on. Since the bit lines C1, C2, C3 and C4 are connected to the drains/sources of the transistor 141, 142, 143 and 144, the logic levels of bit lines C1, C2, C3 and C4 are 0, 0, 0 and 0, respectively, when the word line R4 is selected.

Afterwards, the column address decoder 101 receives the column address 105 and accordingly selects a voltage level from one of the bit lines C1~C4 as the output 106. Therefore, the output 106 can be a value selected from the 16 values (0, 1, 0, 0), (0, 1, 0, 1), (1, 0, 1, 0), (0, 0, 0, 0) according to the row and column address 104 and 105. That is to say, the Mask ROM in FIG. 1 is a 16-bit ROM.

Generally, there are two kinds of code used to carry out the connections between the transistors and the bit lines. They are Buried P+ Code and Via Code. In a Buried P+ Code Mask ROM, the Buried P+ Code is under the gate of a transistor so that it is possible for two adjacent transistors to have a common drain/source. However, in a Via Code Mask ROM, the Via Code is under the drain/source of a transistor so that a common drain/source for two adjacent transistors is not practicable. Thus makes the required circuit area for the Via Code Mask ROM larger than that for the Buried P+ Code Mask ROM.

SUMMARY OF THE INVENTION

In order to solve the above problem, it is therefore one object of the invention to provide a Via Code Mask ROM with a smaller circuit area.

The present invention provides a Via Code Mask read-only memory comprising an array of transistors, and a plurality of bit lines and word lines, wherein the transistors in each row of the array are connected in series by connection of a drain/source of one transistor with a drain/source of another transistor. Both ends of the series of the transistors in each row of the array are connected to a supply voltage together. Each one of the bit lines is selectively connected to drain(s)/source(s) of one or more transistors in one corresponding column. Each one of the word lines connects together gates of the transistors in one corresponding row.

Accordingly, in the present invention, most of the transistors are placed at the spaces between two adjacent bit lines. People skilled in the art will appreciate that there is sufficient space between two adjacent bit lines. Thus, there is no need for an additional circuit area for the transistors, which makes the whole circuit area of a Via Code Mask ROM smaller.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
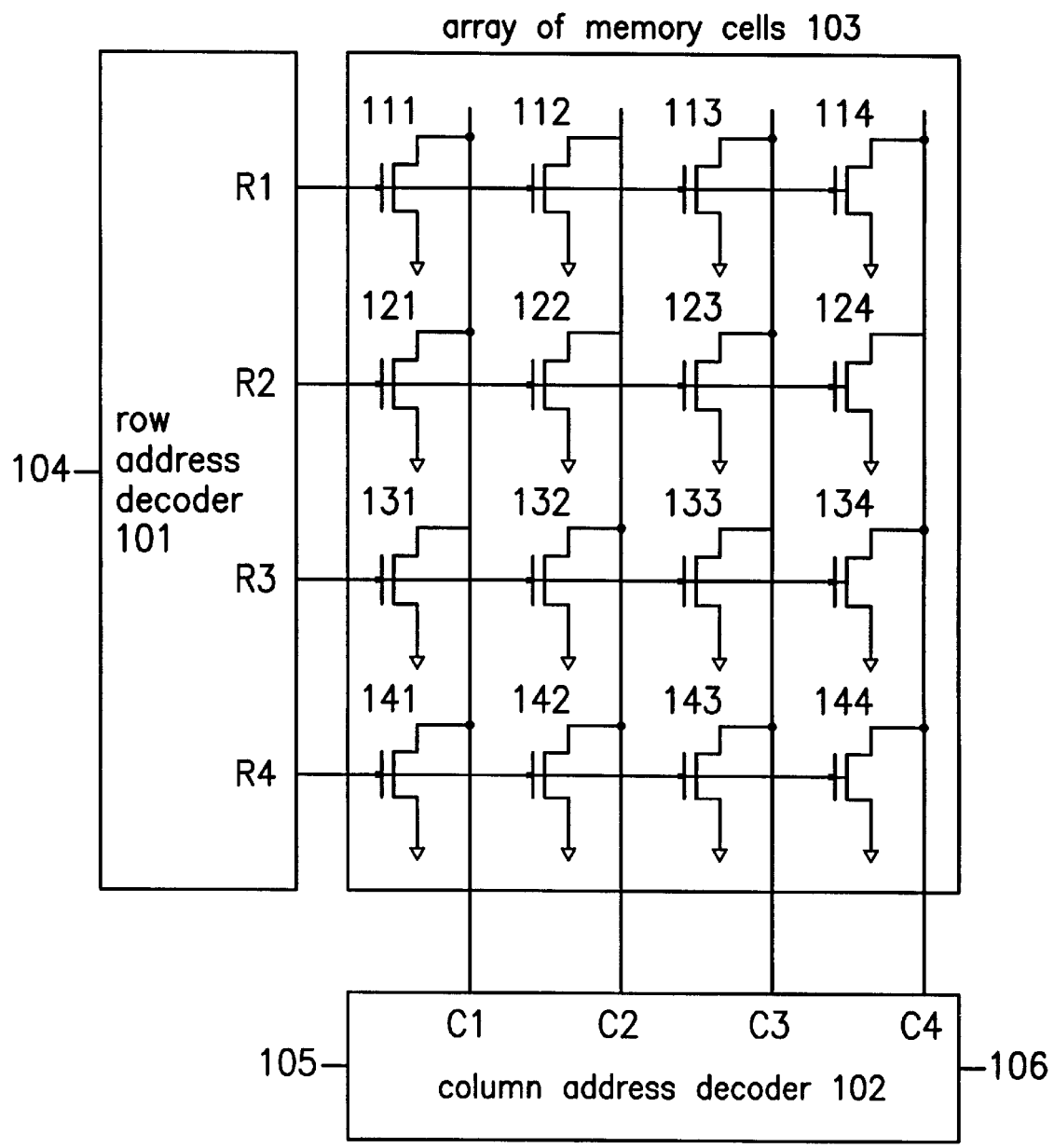
FIG. 1 is a block diagram showing a circuit of a traditional Mask ROM.
Figure 2:
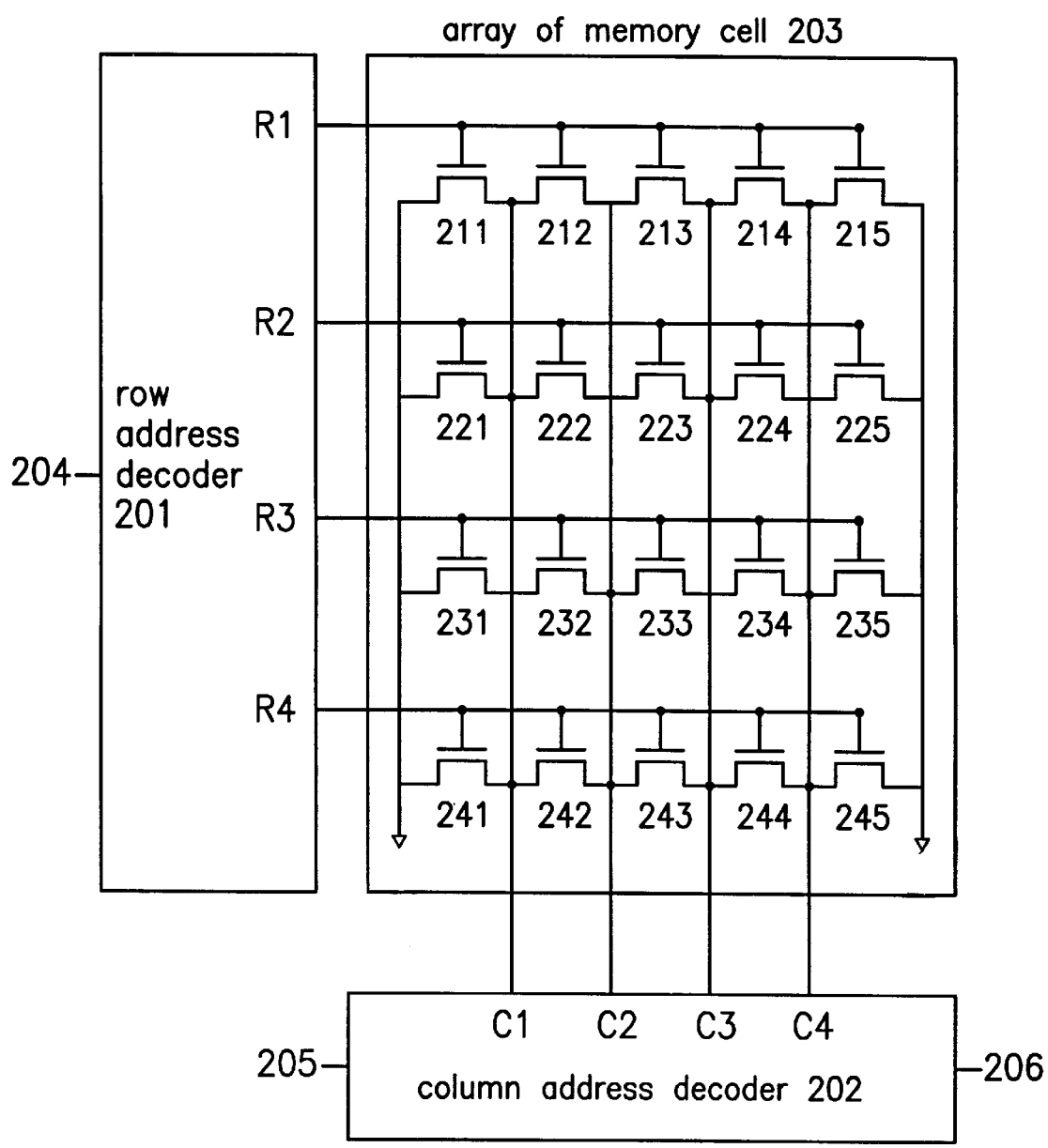
FIG. 2 is a a block diagram showing a circuit of a Via Code Mask ROM according to the invention.

FIG. 2 is a a block diagram showing a circuit of a Via Code Mask ROM according to the invention. The Mask ROM shown in FIG. 1 and FIG. 2 are both 16-bit ROMs and store the same information. The distinction between them is the configuration of the array of the transistors. Referring to FIG. 2, according to one embodiment of the invention, a Via Code Mask ROM comprises a row address decoder 201 receiving a row address 204, a column address decoder 202 receiving a column address 205 and having an output 206, and an array 203 of memory cells. The array 203 of memory cells comprises an array of transistors 211~245, 4 bit lines C1~C4 connected to the column address decoder 202 and 4 word lines R1~R4 connected to the row address decoder 201. In the array of the transistors 211~245, it is noted that the transistors in one row, transistors 211~215 for example, are connected in series by connection of a drain/source of one transistor with a drain/source of another transistor. In addition, both ends of the series of the transistors in one row are connected to a supply voltage Vss (not shown) or ground together. The connections between the transistors 211~244 and the bit lines C1~C4 are carried out by Via Code and shown in FIG. 2, wherein a black dot on the intersection of two crossed lines represents an electrical connection.

The operation of the Via Code Mask ROM in FIG. 2 will be explained below. Initially, given that the voltage level on each of the word lines R1~R4 is lower than the threshold voltage, all the transistors 211~244 are turned off and the voltage level on each of the bit lines C1~C4 represents a "1" (logic high). When receiving the row address 204, the row address decoder 201 pulls up the voltage level on one of the word lines R1~R4 accordingly, to turn on a corresponding row of transistors. Thus, the voltages on all the drains/sources of the transistors in that row are Vss or ground which represents "0" (logic low). Specifically, if the word line R1 is selected, the voltage level thereon is pulled up to be higher than the threshold voltage and the transistors 211~215 are turned on. Since there are connections between bit lines C1, C3, C4 and the transistors 211~215, the logic levels of bit lines C1, C2, C3 and C4 are 0, 1, 0 and 0, respectively, when the word line R1 is selected. If the word line R2 is selected, the voltage level thereon is pulled up to be higher than the threshold voltage and the transistors 221~225 are turned on. Since there are connections between bit lines C1, C3 and the transistors 221~225, the logic levels of bit lines C1, C2, C3 and C4 are 0, 1, 0 and 1, respectively, when the word line R2 is selected. If the word line R3 is selected, the voltage level thereon is pulled up to be higher than the threshold voltage and the transistors 231~235 are turned on. Since there are connections between bit lines C2, C4 and the transistors 231~235, the logic levels of bit lines C1, C2, C3 and C4 are 1, 0, 1 and 0, respectively, when the word line R3 is selected. If the word line R4 is selected, the voltage level thereon is pulled up to be higher than the threshold voltage and the transistors 241~245 are turned on. Since there are connections between bit lines C1, C2, C3, C4 and the transistors 241~245, the logic levels of bit lines C1, C2, C3 and C4 are 0, 0, 0 and 0, respectively, when the word line R4 is selected.

Afterwards, the column address decoder 201 receives the column address 205 and accordingly selects a voltage level from one of the bit lines C1~C4 as the output 206. Therefore, the output 206 can be a value selected from the 16 values (0, 1, 0, 0), (0, 1, 0, 1), (1, 0, 1, 0), (0, 0, 0, 0) according to the row and column address 204 and 205.

In the above embodiment of the invention, most of the transistors are placed at the spaces between two adjacent bit lines. There is no need for an additional circuit area for the transistors. Additionally, it is noted that the number of the columns of the transistors in FIG. 2 is greater than that in FIG. 1 by 1. However, in a large-scale array of memory cells, the circuit area saved due to the elimination of the additional area for the transistors is far greater than that increased due to the additional column of transistors. Therefore, a Via Code Mask ROM with smaller circuit is possible.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A Via Code Mask read-only memory, comprising:

an array of transistors, wherein by connection of a drain/source of one transistor with a drain/source of another transistor, the transistors in each row of the array are connected in series, and both ends of the series of the transistors in each row are connected to a supply voltage together;

a plurality of bit lines, wherein each one of the bit lines is selectively connected to drain(s)/source(s) of one or more transistors in one corresponding column with a Via Code connection, the number of the bit lines being one less than the number of the columns of the array; and a plurality of word lines, wherein each one of the word lines connects together gates of the transistors in one corresponding row.

2. The Via Code Mask read-only memory as claimed in claim 1, wherein the supply voltage is a ground voltage.

3. A Via Code Mask read-only memory, comprising:

an array of memory cells comprising:

an array of transistors, wherein by connection of a drain/source of one transistor with a drain/source of another transistor, the transistors in each row of the array are connected in a series, and both ends of the series of the transistors in each row of the array are connected to a supply voltage together;

a plurality of bit lines, wherein each one of the bit lines is selectively connected to drain(s)/source(s) of one or more transistors in one corresponding column with a Via Code connection, the number of the bit lines being one less than the number of the columns of the array; and a plurality of word lines, wherein each one of the word lines connects together gates of the transistors in one corresponding row;

a row address decoder receiving a row address and accordingly turning on all the transistors in one of the rows of the array through one of the corresponding word lines; and a column address decoder receiving a column address, selecting one of the bit lines accordingly and outputting a voltage on the selected bit line.

4. The Via Code Mask read-only memory as claimed in claim 3, wherein the supply voltage is a ground voltage.

* * * * *